United States Patent
Lee et al.

(10) Patent No.: US 9,953,956 B2
(45) Date of Patent: Apr. 24, 2018

(54) PACKAGE SUBSTRATE AND PACKAGE STRUCTURE USING THE SAME

(71) Applicant: Genesis Photonics Inc., Tainan (TW)

(72) Inventors: Hao-Chung Lee, Tainan (TW); Yu-Feng Lin, Tainan (TW); Xun-Xain Zhan, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

(21) Appl. No.: 15/073,707

(22) Filed: Mar. 18, 2016

(65) Prior Publication Data
US 2016/0284666 A1 Sep. 29, 2016

Related U.S. Application Data

(60) Provisional application No. 62/134,577, filed on Mar. 18, 2015.

(51) Int. Cl.
*H01L 33/50* (2010.01)
*H01L 25/065* (2006.01)
(Continued)

(52) U.S. Cl.
CPC ........ *H01L 25/0655* (2013.01); *H01L 23/562* (2013.01); *H01L 23/60* (2013.01); *H01L 27/15* (2013.01); *H01L 29/866* (2013.01); *H01L 33/10* (2013.01); *H01L 33/48* (2013.01); *H01L 33/486* (2013.01); *H01L 33/50* (2013.01); *H01L 33/502* (2013.01); *H01L 33/60* (2013.01); *H01L 33/642* (2013.01); *H01L 33/647* (2013.01); *H01L 25/0753* (2013.01); *H01L 33/508* (2013.01);
(Continued)

(58) Field of Classification Search
CPC ......... H01L 33/08; H01L 33/50; H01L 33/52; H01L 33/62
See application file for complete search history.

(56) References Cited

U.S. PATENT DOCUMENTS 7,810,956 B2  10/2010  Bierhuizen et al.
7,888,691 B2   2/2011  Krames
(Continued)

FOREIGN PATENT DOCUMENTS

CN    102468417 A    5/2012
JP    2011114093 A   6/2011
(Continued)

OTHER PUBLICATIONS

U.S. Appl. No. 15/073,715, filed Sep. 22, 2016.
(Continued)

*Primary Examiner* — Phat X Cao
(74) *Attorney, Agent, or Firm* — McClure, Qualey & Rodack, LLP

(57) ABSTRACT

A package substrate is provided. The package substrate includes a base layer having a first surface and a second surface opposite to the first surface, a plurality of through holes penetrating the base layer, a first metal layer disposed on the first surface, and a second metal layer disposed on the second surface. The first metal layer includes a closed-loop trench. A part of the second metal layer is electrically connected to the first metal layer via the through holes. The through holes are positioned at an inner part the closed-loop trench.

18 Claims, 5 Drawing Sheets

(51) Int. Cl.
  *H01L 33/60* (2010.01)
  *H01L 23/00* (2006.01)
  *H01L 33/10* (2010.01)
  *H01L 23/60* (2006.01)
  *H01L 29/866* (2006.01)
  *H01L 33/48* (2010.01)
  *H01L 27/15* (2006.01)
  *H01L 33/64* (2010.01)
  *H01L 25/075* (2006.01)
  *H01L 33/56* (2010.01)

(52) U.S. Cl.
  CPC .... *H01L 33/56* (2013.01); *H01L 2224/16225* (2013.01); *H01L 2224/48091* (2013.01); *H01L 2224/49107* (2013.01); *H01L 2924/18161* (2013.01); *H01L 2933/0025* (2013.01); *H01L 2933/0033* (2013.01); *H01L 2933/0041* (2013.01); *H01L 2933/0058* (2013.01)

(56) References Cited

U.S. PATENT DOCUMENTS

| | | |
|---|---|---|
| 8,350,283 B2 | 1/2013 | Nishiuchi et al. |
| 8,399,275 B2 | 3/2013 | Akimoto et al. |
| 8,461,607 B2 | 6/2013 | Tsang |
| 8,523,626 B2 | 9/2013 | Suehiro |
| 8,723,167 B2 | 5/2014 | Sato et al. |
| 8,771,577 B2 | 7/2014 | Basin et al. |
| 8,860,061 B2 | 10/2014 | Kotani |
| 8,877,528 B2 | 11/2014 | Doyabu et al. |
| 8,890,188 B2 | 11/2014 | Park et al. |
| 9,065,033 B2 | 6/2015 | Lee et al. |
| 9,419,189 B1 | 8/2016 | David et al. |
| 2004/0119402 A1 | 6/2004 | Shiang et al. |
| 2007/0012940 A1 | 1/2007 | Suh et al. |
| 2007/0114552 A1 | 5/2007 | Jang et al. |
| 2007/0236940 A1 | 10/2007 | Kuroda et al. |
| 2008/0123024 A1 | 5/2008 | Han et al. |
| 2008/0246902 A1 | 10/2008 | Cheng |
| 2009/0296389 A1 | 12/2009 | Hsu |
| 2010/0052001 A1 | 3/2010 | Li et al. |
| 2010/0066236 A1 | 3/2010 | Xu et al. |
| 2010/0117530 A1 | 5/2010 | Lin et al. |
| 2010/0258830 A1 | 10/2010 | Ide et al. |
| 2011/0001157 A1 | 1/2011 | McKenzie et al. |
| 2011/0102883 A1 | 5/2011 | Narendran et al. |
| 2011/0198780 A1 | 8/2011 | Basin et al. |
| 2011/0309398 A1 | 12/2011 | Ito et al. |
| 2012/0025218 A1 | 2/2012 | Ito et al. |
| 2012/0061700 A1 | 3/2012 | Eder et al. |
| 2012/0077292 A1 | 3/2012 | Chang et al. |
| 2012/0161164 A1 | 6/2012 | Kim |
| 2012/0181569 A1* | 7/2012 | Choi ............... H01L 33/62 257/99 |
| 2012/0223351 A1 | 9/2012 | Margalit |
| 2012/0235126 A1 | 9/2012 | Yamazaki et al. |
| 2012/0236582 A1 | 9/2012 | Waragaya et al. |
| 2012/0250320 A1 | 10/2012 | Harbers et al. |
| 2013/0001605 A1 | 1/2013 | Ishihara et al. |
| 2013/0015483 A1 | 1/2013 | Shimokawa et al. |
| 2013/0037842 A1 | 2/2013 | Yamada et al. |
| 2013/0094177 A1 | 4/2013 | Edwards |
| 2013/0105978 A1 | 5/2013 | Hung |
| 2013/0194794 A1 | 8/2013 | Kim |
| 2013/0207141 A1 | 8/2013 | Reiherzer |
| 2013/0207142 A1 | 8/2013 | Reiherzer |
| 2014/0021493 A1 | 1/2014 | Andrews et al. |
| 2014/0054621 A1 | 2/2014 | Seko |
| 2014/0117396 A1 | 5/2014 | Eisert et al. |
| 2014/0124812 A1* | 5/2014 | Kuramoto ............... H01L 33/54 257/98 |
| 2014/0153238 A1 | 6/2014 | Nishimura et al. |
| 2014/0186979 A1 | 7/2014 | Tu et al. |
| 2014/0203451 A1* | 7/2014 | Kwon ............... H01L 23/481 257/774 |
| 2014/0252389 A1 | 9/2014 | Koizumi et al. |
| 2015/0102373 A1 | 4/2015 | Lee et al. |
| 2015/0102377 A1 | 4/2015 | Huang et al. |
| 2015/0115300 A1 | 4/2015 | Tomizawa et al. |
| 2015/0179901 A1 | 6/2015 | Ok et al. |
| 2015/0200338 A1 | 7/2015 | Kim et al. |
| 2015/0263242 A1 | 9/2015 | Tomizawa et al. |
| 2015/0280078 A1 | 10/2015 | Yen et al. |
| 2016/0013373 A1 | 1/2016 | Bhat et al. |
| 2016/0155915 A1 | 6/2016 | Ling et al. |
| 2016/0181476 A1 | 6/2016 | Chang et al. |

FOREIGN PATENT DOCUMENTS

| | | |
|---|---|---|
| JP | 2012227470 A | 11/2012 |
| TW | 200841089 A | 10/2008 |
| TW | 200929615 A | 7/2009 |
| TW | 201017934 A1 | 5/2010 |
| TW | 201133956 A | 10/2011 |
| TW | 201210819 A1 | 3/2012 |
| TW | 201218428 A | 5/2012 |
| TW | 201220534 A1 | 5/2012 |
| TW | 201220560 A | 5/2012 |
| TW | 201242108 A1 | 10/2012 |
| TW | 201249898 A1 | 12/2012 |
| TW | 201308691 A | 2/2013 |
| TW | 201319460 A | 5/2013 |
| TW | 201507209 A | 2/2015 |
| TW | 201515282 A | 4/2015 |

OTHER PUBLICATIONS

U.S. Appl. No. 15/073,672, filed Sep. 22, 2016.
U.S. Appl. No. 15/268,654, filed Jan. 5, 2017.
U.S. Appl. No. 15/073,673, filed Sep. 22, 2016.
Non-Final Office Action issued in U.S. Appl. No. 15/045,471, filed Feb. 17, 2016, dated Oct. 25, 2016.
Non-Final Office Action issued in U.S. Appl. No. 14/711,798, filed May 14, 2015, dated Dec. 16, 2016.
U.S. Appl. No. 15/787,811, filed Oct. 19, 2017 and the contents therein.
U.S. Appl. No. 15/788,757 and the contents therein.
Final Office Action issued in U.S. Appl. No. 14/542,657, filed Nov. 17, 2014, dated May 6, 2016.
Office Action (Restriction/Election) issued in U.S. Appl. No. 15/073,715, filed Mar. 18, 2016, dated May 24, 2017.
Non-Final Office Action issued in U.S. Appl. No. 14/542,657, filed Nov. 17, 2014, dated Oct. 7, 2015.
Final Office Action issued in U.S. Appl. No. 14/542,657, filed Nov. 17, 2014, dated Sep. 29, 2017.
CN Office Action dated May 22, 2017 in Chinese application (No. 201410362787.6).
TIPO Office Action dated Aug. 10, 2017 in Taiwan application (No. 106108220).
TIPO Office Action dated Nov. 17, 2016 in Taiwan application (No. 104144809).
Non-Final Office Action issued in U.S. Appl. No. 15/268,681, filed Sep. 19, 2016, dated Feb. 7, 2017.
Final Office Action issued in U.S. Appl. No. 14/542,657, filed Nov. 17, 2014, dated Jan. 25, 2017.
Final Office Action issued in U.S. Appl. No. 14/711,798, filed May 14, 2015, dated Jul. 28, 2017.
Non-Final Office Action issued in U.S. Appl. No. 15/268,654, filed Sep. 19, 2016, dated Jun. 15, 2017.
Non-Final Office Action issued in U.S. Appl. No. 15/073,672, filed Mar. 18, 2016, dated Mar. 10, 2017.
TIPO Office Action dated Dec. 22, 2016 in Taiwan application (No. 105126842).
Non-Final Office Action issued in U.S. Appl. No. 14/462,581, filed Aug. 19, 2014, dated Aug. 20, 2015.
Non-Final Office Action issued in U.S. Appl. No. 15/073,673, filed Mar. 18, 2016, dated Mar. 31, 2017.
Non-Final Office Action issued in U.S. Appl. No. 15/168,218, filed May 30, 2016, dated Nov. 4, 2016.

(56) References Cited

OTHER PUBLICATIONS

TIPO Office Action dated Jan. 9, 2018 in Taiwan application (No. 106135995).
TIPO Office Action dated Jan. 16, 2018 in Taiwan application (No. 106131096).
CN Office Action dated Nov. 14, 2017 in Chinese application (No. 201410362787.6).
Final Office Action issued in U.S. Appl. No. 15/073,673, filed Mar. 18, 2016, dated Feb. 8, 2018.

* cited by examiner

PACKAGE SUBSTRATE AND PACKAGE STRUCTURE USING THE SAME

This application claims the benefit of U.S. Provisional application Ser. No. 62/134,577, filed Mar. 18, 2015, the present disclosure of which is incorporated by reference herein in its entirety.

TECHNICAL FIELD

The disclosure relates in general to a package substrate and a package structure using the same, and more particularly to a package substrate having trenches and a package structure using the same.

BACKGROUND

In an ordinary package structure, the chip is packaged using a resin to avoid the light being laterally emitted from the chip. However, during the manufacturing process of the package structure, the resin is not easy to control, and outflow of the resin may arise easily. Besides, when the package substrate is coated with a solder paste containing a flux, gas bubbles may easily be generated and the soldering quality would deteriorate accordingly.

Therefore, it has become a prominent task for the industries to provide a package substrate capable of resolving the above problems.

SUMMARY

The disclosure is directed to a package substrate having trenches and a package structure using the same. Through the design of forming trenches on a front side and forming a specific heat dissipation structure on a rear side of the package substrate, the outflow of resin can be effectively avoided and the soldering quality can be increased.

According to one embodiment of the disclosure, a package substrate including a base layer, a plurality of through holes, a first metal layer and a second metal layer is provided. The base layer has a first surface and a second surface opposite to the first surface. The through holes penetrate through the base layer. The first metal layer is disposed on the first surface, and includes a closed-loop trench. The second metal layer is disposed on the second surface, and a part of the second metal layer is electrically connected to the first metal layer via the through holes. The through holes are positioned at an inner part of the closed-loop trench.

According to another embodiment of the disclosure, a package structure including a package substrate, a chipset and an encapsulant layer is provided. The package substrate includes a base layer, a plurality of through holes, a first metal layer and a second metal layer. The base layer has a first surface and a second surface opposite to the first surface. The through holes penetrate through the base layer. The first metal layer is disposed on the first surface, and includes a closed-loop trench. The second metal layer is disposed on the second surface, and a part of the second metal layer is electrically connected to the first metal layer via the through holes. The chipset and the encapsulant layer are disposed on the first metal layer, and positioned at an inner part of the closed-loop trench.

According to an alternate embodiment of the disclosure, a manufacturing method of package structure including following steps are provided. A package substrate, including a base layer, a first metal layer and a second metal layer, is provided, wherein the base layer has a first surface and a second surface opposite to the first surface, the first metal layer is disposed on the first surface and includes a closed-loop trench, and the second metal layer is disposed on the second surface. A chipset is provided on the first metal layer. An encapsulant layer is provided on the first metal layer. The chipset and the encapsulant layer are positioned at an inner part of the closed-loop trench.

The above and other aspects of the disclosure will become better understood with regard to the following detailed description of the preferred but non-limiting embodiment(s). The following description is made with reference to the accompanying drawings.

DETAILED DESCRIPTION

Figure 1:
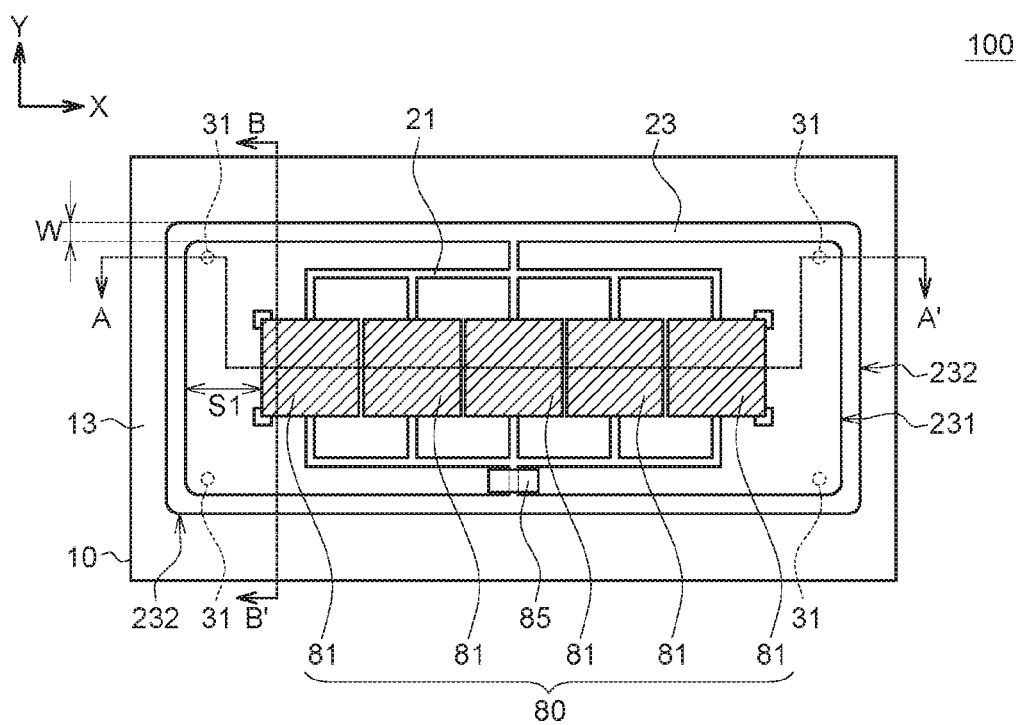
FIG. 1 shows a top view of a package structure according to an embodiment of the present disclosure.

A number of embodiments of the present disclosure are disclosed below with reference to accompanying drawings. However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

Figure 2A:
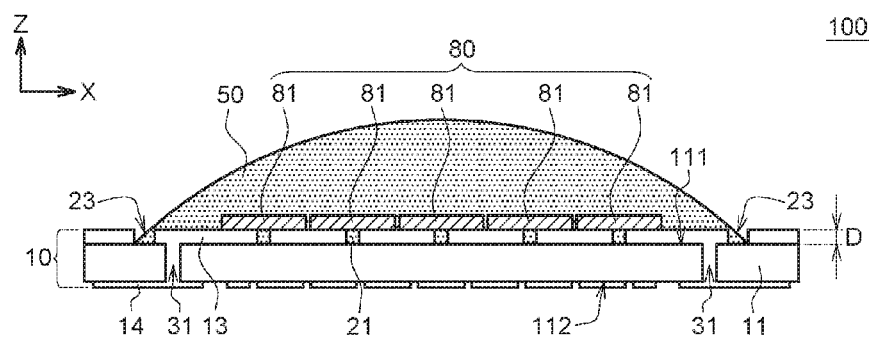
FIG. 2A shows a cross-sectional view of a package structure along a cross-sectional line A-A' of FIG. 1 according to an embodiment of the present disclosure.
Figure 2B:
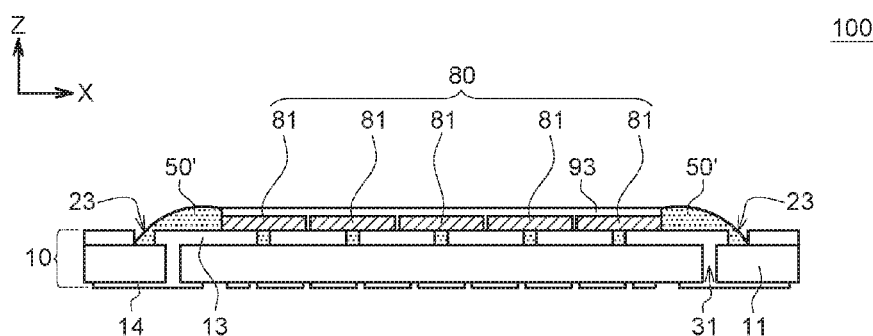
FIG. 2B shows a cross-sectional view of a package structure along a cross-sectional line A-A' of FIG. 1 according to another embodiment of the present disclosure.

FIG. 1 shows a top view of a package structure 100 of an embodiment of the present disclosure. FIG. 2A shows a cross-sectional view of a package structure 100 along a cross-sectional line A-A' of FIG. 1 according to an embodiment of the present disclosure. FIG. 2B shows a cross-sectional view of a package structure 100 along a cross-sectional line A-A' of FIG. 1 according to another embodiment of the present disclosure. It should be noted that some elements of FIG. 1 are omitted, such that the relationships between other elements disposed on the package substrate 10 may be clearly illustrated.

As indicated in FIGS. 1 and 2A, the package structure 100 of an embodiment of the present disclosure includes a package substrate 10, a chipset 80 to an encapsulant layer 50. In the present embodiment, the package substrate 10 may include a base layer 11, a plurality of through holes (via hole) 31, a first metal layer 13 and a second metal layer 14. The base layer 11 has a first surface 111 and a second surface 112 disposed oppositely. The through holes 31 penetrate through the base layer 11. The first metal layer 13 is disposed on the first surface 111 of the base layer 11. The second metal layer 14 is disposed on the second surface 112 of the base layer 11, and a part of the second metal layer 14 is electrically connected to the first metal layer 13 via through holes 31. The chipset 80 and the encapsulant layer 50 are disposed on the first metal layer 13.

As indicated in FIG. 1, the first metal layer 13 may be divided into an inner part and an outer part by a closed-loop trench 23. In the present embodiment, the through holes 31, the chipset 80 and the encapsulant layer 50 are positioned at the inner part of the closed-loop trench 23. Here, the inner part of the closed-loop trench 23 is defined as the space inside an outer sidewall 232 of the closed-loop trench 23. That is, the encapsulant layer 50 may fill up the closed-loop trench 23 without crossing over the outer sidewall 232 of the closed-loop trench 23. Besides, an inner part of the first metal layer 13 may be insulated from an outer part of the first metal layer 13 by the closed-loop trench 23. That is, the part of the first metal layer 13 inside the closed-loop trench 23 is insulated from the part of the first metal layer 13 outside the closed-loop trench 23 to avoid the inner part and the outer part of the first metal layer 13 from short-circuiting each other.

In an embodiment, the base layer 11 may be formed of a ceramic material, such as aluminum nitride or aluminum oxide. The first metal layer 13 and the second metal layer 14 may be realized by a copper layer. In some embodiments, the package substrate 10 may further include a plating layer (not illustrated) formed of such as gold or silver. The plating layer may be formed on the first metal layer 13 and the second metal layer 14 to avoid the first metal layer 13 and the second metal layer 14 from being vulcanized.

As indicated in FIGS. 1 and 2A, the package substrate 10 may have a plurality of separation structures 21 disposed on the first surface 111 of the base layer 11. For example, the separation structures 21 may be form by etching the first metal layer 13 to expose a part of the first surface 111 of the base layer 11. In the present embodiment, the chipset 80 is disposed on the separation structures 21, and the separation structures 21 are connected with the closed-loop trench 23.

In the present embodiment, the chipset 80 includes a plurality of chips 81. The distance between the chips 81 is such as 50 μm. Furthermore, the chips 81 may be realized by light-emitting diode chips formed on the first metal layer 13 in the form of flip chips, lateral chips, or vertical chips.

Although FIGS. 1 and 2A show that the chipset 80 includes 5 squared chips 81, the present disclosure is not limited thereto. In some embodiments, the chipset 80 may include only one single rectangular chip. If the chipset includes only one single chip, the single chip is free of pitch, and no dark area would be formed when the chipset works with other reflective elements and lens set to emit lights. That is, the shape and quantity of the chips included in the chipset may be adjusted according to the design needs.

In an embodiment, the width W of the closed-loop trench 23 may range from 80 to 300 μm, and the depth D of the closed-loop trench may be adjusted according to the thickness of the first metal layer 13. For example, the depth D of the closed-loop trench 23 may range from 40 to 80 μm. Here, the width W of the closed-loop trench 23 is defined as the distance between the inner sidewall 231 and the outer sidewall 232 of the closed-loop trench 23, and the depth D of the closed-loop trench 23 is defined as the depth of the closed-loop trench 23 along a direction perpendicular to the first surface 111 of the base layer 11 (Z direction). Moreover, the shortest distance S1 between the closed-loop trench 23 and the chipset 80 may range from 500 to 2000 μm.

Due to the design of the closed-loop trench 23 and the surface tension of the encapsulant layer 50, the encapsulant layer 50 may be controlled to fill up the closed-loop trench 23 without crossing over the outer sidewall 232 of the closed-loop trench 23 during the manufacturing process. Thus, the encapsulant layer 50 may be effectively prevented from overflowing to the area surrounded by the closed-loop trench 23 from the closed-loop trench 23. Furthermore, since the separation structures 21 disclosed in the embodiment of the present disclosure are connected with the closed-loop trench 23, the encapsulant layer 50 may fill up the separation structures 21 as well.

In an embodiment, the encapsulant layer 50 may be formed of transparent silicone or may include silicone and phosphor powder. As indicated in FIG. 2A, the encapsulant layer 50 may cover the chipset 80, but the present disclosure is not limited thereto.

In another embodiment of the present disclosure indicated in FIG. 2B, the encapsulant layer 50' does not cover the chipset 80. That is, the encapsulant layer 50' may be positioned on a lateral surface of the chipset 80 and a top surface of the chipset 80 may be exposed. In the present embodiment, a wavelength conversion layer 93 may be formed on the top surface of the chipset 80. For example, the wavelength conversion layer 93 may be formed on the top surface of the chipset 80 by way of spraying or mounting a phosphor film on the top surface. Since the wavelength conversion layer 93 uniformly formed on the top surface of the chipset 80 by way of spraying is thinner, the encapsulant layer 50' may be thinned accordingly.

Besides, the encapsulant layer 50' positioned on the lateral surface of the chipset 80 may include silicone and titanium dioxide ($TiO_2$), a viscosity of the encapsulant layer 50' may range from 1000 to 20000 mPa·s, and a reflectivity of the encapsulant layer 50' may range from 90% to 99%, such as 95%.

In an embodiment, the package structure 100 may include an electrostatic protection element 85 disposed on the first surface 111 of the base layer 11 for protecting the chipset 80 from damage.

Figure 3A:
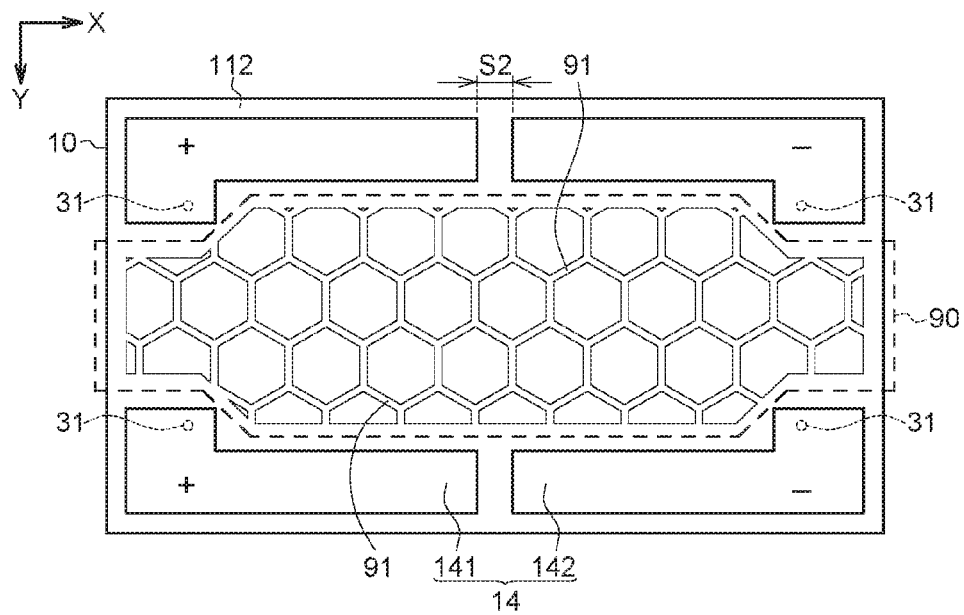
FIG. 3A shows a bottom view of a package structure according to an embodiment of the present disclosure.
Figure 3B:
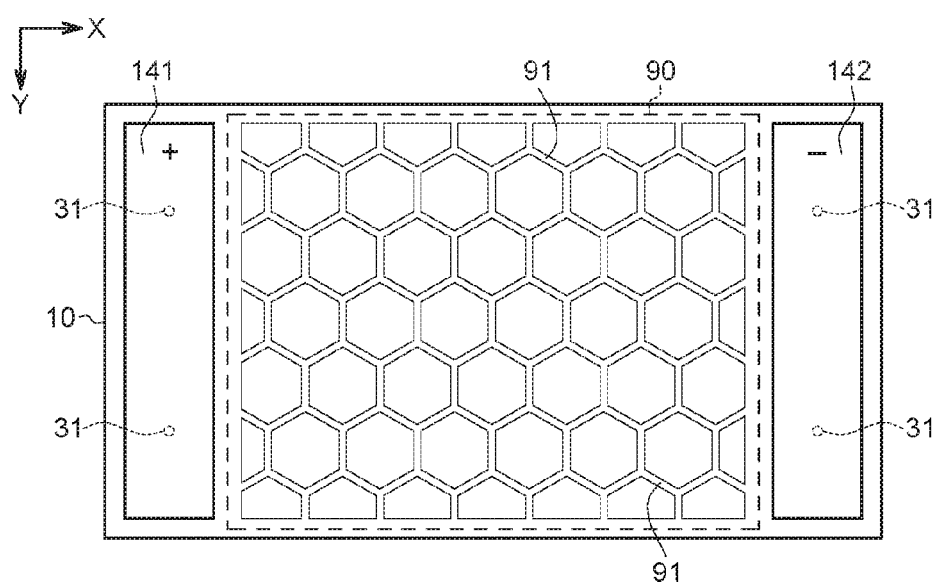
FIG. 3B shows a bottom view of a package structure according to another embodiment of the present disclosure.

FIG. 3A shows a bottom view of a package structure 100 of an embodiment of the present disclosure. FIG. 3B shows a bottom view of a package structure 100 of another embodiment of the present disclosure. That is, FIG. 1 shows a front structure of the package structure 100 of the embodiment of the present disclosure, and FIGS. 3A and 3B show a rear structure of the package structure 100 of the embodiment of the present disclosure.

In the present embodiment, the second metal layer 14 of the package substrate 10 may include a heat dissipation region 90, a anode region 141 and a cathode region 142 The heat dissipation region 90, the anode region 141 and the cathode region 142 are disposed on the second surface 112 of the base layer 11. The heat dissipation region 90 corresponds to the chipset 80. The anode region 141 and the cathode region 142 are separated from the heat dissipation region 90. The heat dissipation region 90 may conduct the heat generated by the chipset 80 to the outside of the chipset 80, but is not electrically connected to any elements.

The heat dissipation region 90 is formed of a plurality of trenches 91 arranged in a polygonal or curved array, and may be connected with the outside of the heat dissipation region 90. For example, the trenches 91 may form an array pattern composed of polygons such as triangles, squares, pentagons, or hexagons (as indicated in FIG. 3A). Or, the said array pattern composed of polygons may be replaced with a curved array pattern.

As indicated in FIG. 3A, due to the design of the plurality of trenches 91, the heat dissipation region 90 may be divided into a honeycomb-shaped pattern to facilitate the heat dissipation of the chipset 80. In the follow-up process, the package structure 100 may be coated with a solder paste containing a flux and connected with a circuit board. During the process of heating and connecting the package structure 100 to the circuit board, the solder paste containing the flux may generate gases which may form bubbles at soldering parts, and the soldering quality would deteriorate accordingly. Through the design of connecting the trenches 91 to the outside of the heat dissipation region 90, the generated bubbles may be discharged and the soldering quality may be effectively increased.

The anode region 141 and the cathode region 142 of the package substrate 10 are two parts of the second metal layer 14, and therefore may be electrically connected to the first metal layer 13 via the through holes 31.

Furthermore, the distance between the anode region 141 and the cathode region 142 of the package substrate 10, the distance between the anode region 141 and the heat dissipation region 90, and the distance between the cathode region 142 and the heat dissipation region 90 may be at least 400 μm. As indicated in FIG. 3A, the distance S2 between the anode region 141 and the cathode region 142 of the package substrate 10 is, for example, 400 μm.

Figure 4A:
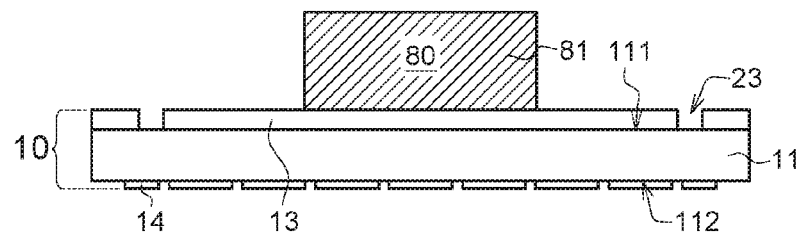
FIGS. 4A-4C show an embodiment of the manufacturing process of the package structure of the present disclosure.
Figure 4B:
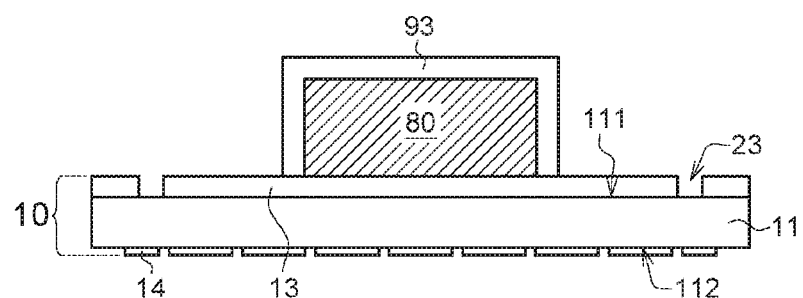
Figure 4C:
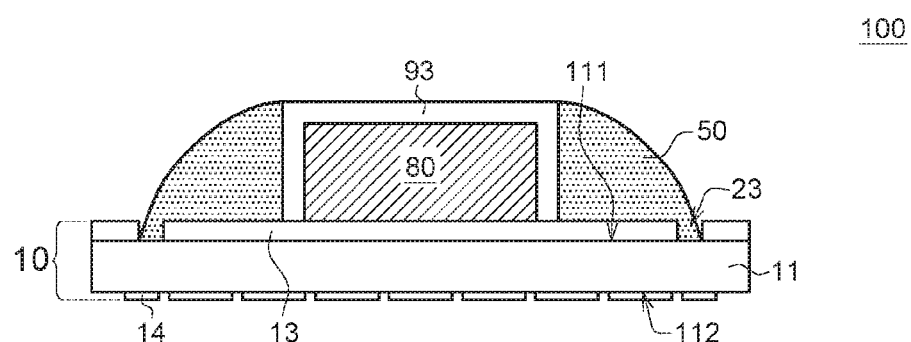

The package structure of the present disclosure is not limited to the structure illustrated in FIG. 3A. FIG. 3B illustrates a rear structure of a package structure 100 of another embodiment of the present disclosure. In comparison to the structure illustrated in FIG. 3A, the structure illustrated in FIG. 3B has a larger heat dissipation region 90. Although the trenches 91 shown in FIGS. 3A and 3B both are arranged in an array pattern composed of hexagons, the present disclosure is not limited thereto. That is, the shape and quantity of the trenches 91 may be adjusted according to the design needs FIGS. 4A-4C show an embodiment of the manufacturing process of the package structure 100 of the present disclosure, wherein FIG. 4C shows, for example, a cross-sectional view of a package structure along a cross-sectional line B-B' of FIG. 1 according to an embodiment of the present disclosure. It should be noted that some elements may be omitted in following drawings, such that the manufacturing process of the package structure 100 can be clearly illustrated.

As indicated in FIG. 4A, a package substrate 10 is provided. Like the structure illustrated in FIG. 2B, the package substrate 10 of FIG. 4A may include a base layer 11, a first metal layer 13 and a second metal layer 14 The base layer 11 has a first surface 111 and a second surface 112 disposed oppositely, the first metal layer 13 is disposed on the first surface 111 and includes a closed-loop trench 23, and the second metal layer 14 is disposed on the second surface 112. Then, a chipset 80 is provided on (the first metal layer 13 of) the package substrate 10.

As indicated in FIG. 4B, a wavelength conversion layer 93 is formed on a surface of the chipset 80. In the present embodiment, the wavelength conversion layer 93 may cover the chipset 80. For example, the wavelength conversion layer 93 may be formed on the surface of the chipset 80 by way of spraying.

Lastly, an encapsulant layer 50 is formed on (the first metal layer 13 of) the package substrate 10. As indicated in FIG. 4C, the chipset 80 to the encapsulant layer 50 both are positioned at the inner part of the closed-loop trench 23, and the encapsulant layer 50 is positioned on the lateral surface of the wavelength conversion layer 93 and the chipset 80 only, and a part of the top surface of the wavelength conversion layer 93 is exposed.

Figure 4D:
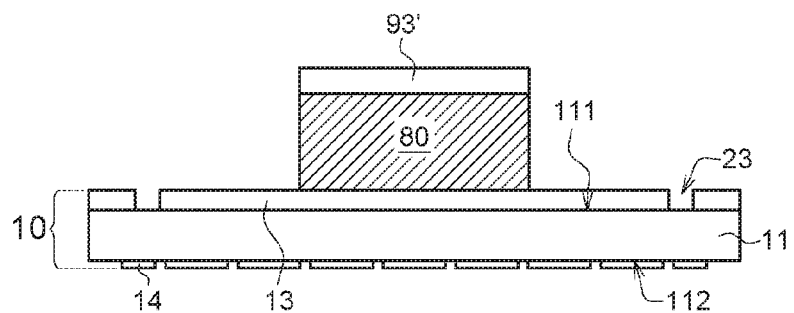
FIGS. 4D-4E show another embodiment of the manufacturing process of the package structure of the present disclosure.
Figure 4E:
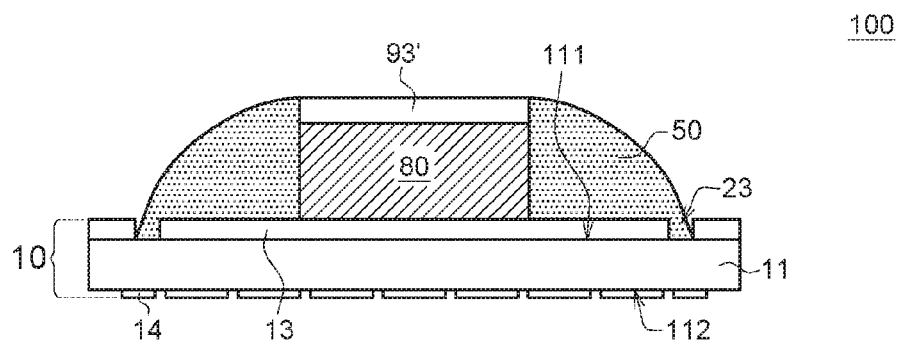

However, the embodiment of the manufacturing process of the package structure 100 of the present disclosure is not limited thereto. FIGS. 4D-4E show another embodiment of the manufacturing process of the package structure 100 of the present disclosure, wherein FIG. 4E shows, for example, a cross-sectional view of a package structure along the cross-sectional line B-B' of FIG. 1 according to another embodiment of the present disclosure. Similarly, some elements may be omitted in following drawings, such that the manufacturing process of the package structure 100 can be clearly illustrated.

The step shown in FIG. 4D continues with of the step shown in FIG. 4A. As indicated in FIG. 4D, a wavelength conversion layer 93' is formed on a top surface of the chipset 80. For example, the wavelength conversion layer 93' may be mounted on the top surface of the chipset 80.

Lastly, as indicated in FIG. 4E, an encapsulant layer 50 is provided on the lateral surfaces of the chipset 80 and the wavelength conversion layer 93'. The encapsulant layer 50 is positioned at the inner part of the closed-loop trench 23, and the top surface of the wavelength conversion layer 93' is exposed.

As disclosed in the above embodiments of the present disclosure, through the design of forming the closed-loop trench 23 on the front side and forming the heat dissipation region 90 on the rear side of the package substrate 10, respectively, overflow of resin can be effectively avoided and the soldering quality can be greatly increased.

It will be apparent to those skilled in the art that various modifications and variations can be made to the disclosed embodiments. It is intended that the specification and examples be considered as exemplary only, with a true scope of the present disclosure being indicated by the following claims and their equivalents.

What is claimed is:
1. A package substrate, comprising:
  a base layer having a first surface and a second surface opposite to the first surface;
  a plurality of through holes penetrating through the base layer;
  a first metal layer disposed on the first surface and comprising an encircling portion and a plurality of upper pads arranged separately, wherein the encircling portion surrounds the upper pads to form a closed-loop trench between the encircling portion and the upper pads, and at least one gap between the upper pads intercommunicates with the closed-loop trench; and
  a second metal layer disposed on the second surface comprising a plurality of bottom pads arranged separately, wherein the bottom pads are electrically connected to the upper pads via the through holes respectively;

wherein the through holes are positioned under the upper pads and the encircling portion of the first metal layer is electrically floating.

2. The package substrate according to claim 1, wherein the second metal layer further comprises:
a heat dissipation region comprising a plurality of heat dissipation pads separated by a plurality of trenches.

3. The package substrate according to claim 1, wherein a width of the closed-loop trench is from 80 to 300 μm.

4. The package substrate according to claim 1, wherein a depth of the closed-loop trench is from 40 to 80 μm.

5. The package substrate according to claim 1, wherein the base layer comprises a ceramic material.

6. The package substrate according to claim 1, further comprising a plating layer formed on the first metal layer and the second metal layer, wherein the plating layer is formed of gold or silver.

7. The package substrate according to claim 2, wherein the heat dissipation pads are electrically floating.

8. The package substrate according to claim 2, wherein the bottom pads of the second metal layer are divided into an anode region and a cathode region separated from and surrounding the heat dissipation region.

9. A package structure, comprising:
a package substrate, comprising:
a base layer having a first surface and a second surface opposite to the first surface;
a plurality of through holes penetrating through the base layer;
a first metal layer disposed on the first surface and comprising an encircling portion and a plurality of upper pads arranged separately, wherein the encircling portion surrounds the upper pads to form a closed-loop trench between the encircling portion and the upper pads, and at least one gap between the upper pads intercommunicates with the closed-loop trench; and
a second metal layer disposed on the second surface comprising a plurality of bottom pads arranged separately, wherein the bottom pads are electrically connected to the upper pads via the through holes respectively, and the encircling portion of the first metal layer is electrically floating; and
at least one chip disposed on the upper pads and electrically connected thereto; and
an encapsulant layer disposed on the package substrate and covering the chip and at least a portion of the upper pads, wherein the encapsulant layer do not extend beyond an outer wall of the closed-loop trench.

10. The package structure according to claim 9, wherein the second metal layer further comprising:
a heat dissipation region corresponding to the chip, comprising a plurality of heat dissipation pads separated by a plurality of trenches.

11. The package structure according to claim 10, wherein the bottom pads of the second metal layer are divided into an anode region and a cathode region separated from and surrounding the heat dissipation region.

12. The package structure according to claim 9, wherein the chip comprises a flip chip.

13. The package structure according to claim 9, wherein when a quantity of the chip is plural, a distances between the chips is 50 μm.

14. The package structure according to claim 9, wherein a distance between the closed-loop trench and the chip is from 500 to 2000 μm.

15. The package structure according to claim 9, wherein the encapsulant layer comprises a resin material mixed with phosphor powder.

16. The package structure according to claim 9, wherein the package substrate further comprises:
a plating layer formed on the first metal layer and the second metal layer;
wherein the plating layer is formed of gold or silver.

17. The package structure according to claim 10, wherein the heat dissipation pads are electrically floating.

18. A package structure, comprising:
a package substrate, comprising:
a base layer having a first surface and a second surface opposite to the first surface;
a plurality of through holes penetrating the base layer;
a first metal layer disposed on the first surface and comprising a closed-loop trench; and
a second metal layer disposed on the second surface, wherein a part of the second metal layer is electrically connected to the first metal layer via the through holes; and
a chipset and an encapsulant layer disposed on the first metal layer and positioned at an inner part of the closed-loop trench,
wherein the second metal layer further comprising a heat dissipation region corresponding to the chipset, and the heat dissipation region is formed of a plurality of trenches arranged in an array of pads,
wherein the second metal layer further comprises an anode region and a cathode region separated from the heat dissipation region, wherein each of a distance between the anode region and the cathode region, a distance between the anode region and the heat dissipation region, and a distance between the cathode region and the heat dissipation region is at least 400 μm.

* * * * *